United States Patent [19]

Schweitzer, Jr. et al.

[11] Patent Number: 6,133,724

[45] Date of Patent: Oct. 17, 2000

[54] REMOTE LIGHT INDICATION FAULT INDICATOR WITH A TIMED RESET CIRCUIT AND A MANUAL RESET CIRCUIT

[75] Inventors: Edmund O. Schweitzer, Jr., Northbrook; Laurence V. Feight, Island Lake, both of Ill.

[73] Assignee: E. O. Schweitzer Manufacturing Co., Ill.

[21] Appl. No.: 09/106,434

[22] Filed: Jun. 29, 1998

[51] Int. Cl.$^7$ .................................................. G01R 19/14
[52] U.S. Cl. ........................................... 324/133; 324/522
[58] Field of Search .................................. 324/508, 509, 324/512, 522, 524, 541, 544, 551, 555, 556, 127, 133, 149; 340/660, 661, 662, 664, 651, 691.1; 361/93.1, 93.4, 94, 71, 75, 59, 87

[56] References Cited

U.S. PATENT DOCUMENTS

| | | | |
|---|---|---|---|
| 3,413,548 | 11/1968 | Schweitzer, Jr. | 324/133 |
| 4,165,528 | 8/1979 | Schweitzer, Jr. | 361/156 |
| 4,234,847 | 11/1980 | Schweitzer, Jr. | 324/146 |
| 4,424,512 | 1/1984 | Schweitzer, Jr. | 340/664 |
| 4,438,403 | 3/1984 | Schweitzer, Jr. | 324/133 |
| 4,458,198 | 7/1984 | Schweitzer, Jr. | 324/133 |
| 4,686,518 | 8/1987 | Schweitzer, Jr. | 340/664 |
| 4,794,332 | 12/1988 | Schweitzer, Jr. | 324/133 |
| 4,795,982 | 1/1989 | Schweitzer, Jr. | 324/508 |
| 5,008,651 | 4/1991 | Schweitzer, Jr. | 340/664 |

*Primary Examiner*—Safet Metjahic
*Assistant Examiner*—Vincent Q. Nguyen
*Attorney, Agent, or Firm*—Cook, Alex, McFarron, Manzo, Cummings & Mehler

[57] ABSTRACT

A fault indicator contained within a protective equipment closure of the type used to house pad-mounted components of a power distribution system detects the occurrence of a fault current in a monitored conductor and provides a light indication thereof. The fault indicator includes a circuit monitoring module, having an integral fault indicator flag module, and a remote fault indicator light module. A status-indicating flag is rotatably mounted in the integral fault indicator flag module. The flag is positioned in either a reset indicating position or a fault indicating position by a magnetic pole piece, which is magnetized in one magnetic direction or the other by momentary application of a current in one direction or the other to an actuator winding on the pole piece. A magnetically actuated reed switch in an auxiliary magnetic circuit comprising an auxiliary pole piece magnetized by the actuator winding and a bias magnet magnetically aligned to oppose the reset magnetic orientation and reenforce the trip magnetic orientation of the magnetic pole piece closes upon occurrence of the fault current to connect an internal battery to an LED contained within the remote fault indicator light module so that the LED is visible from the exterior of the protective equipment enclosure. The light indication of the fault occurrence may be reset automatically by a timed reset circuit or manually by a manual reset circuit.

35 Claims, 8 Drawing Sheets

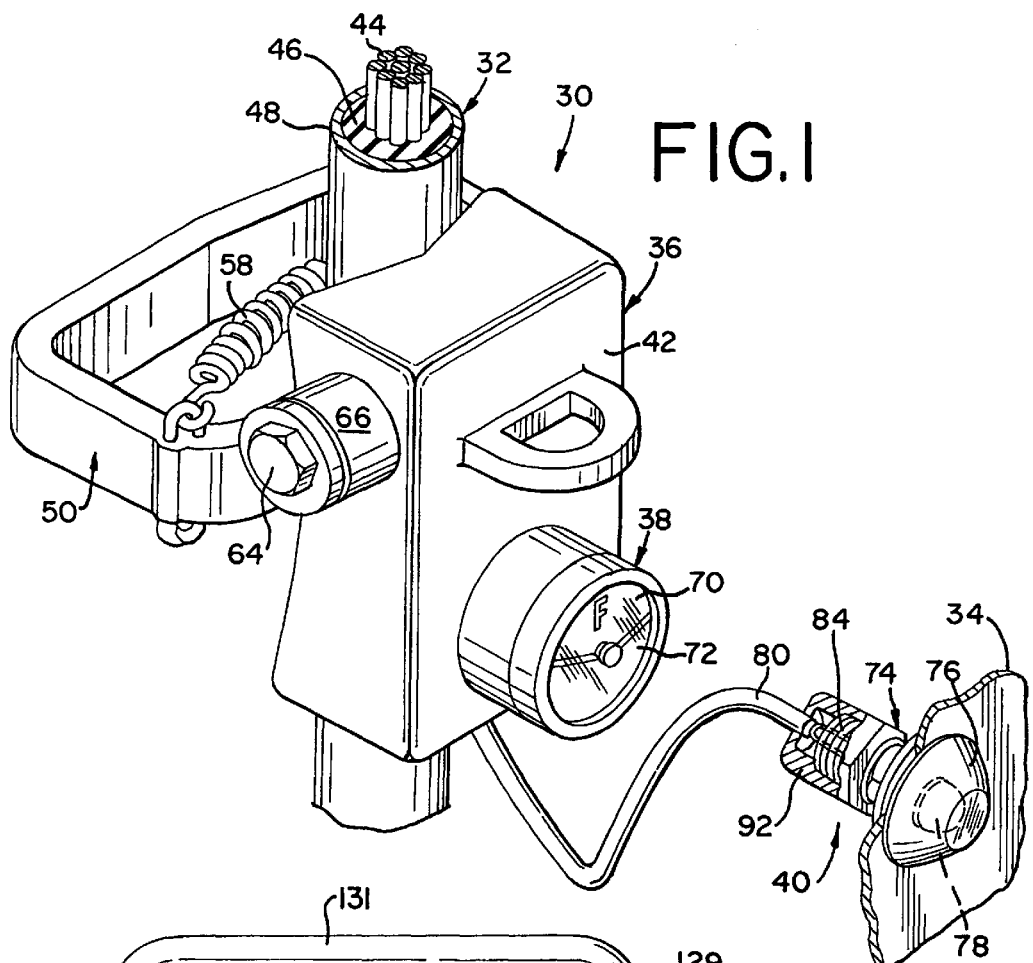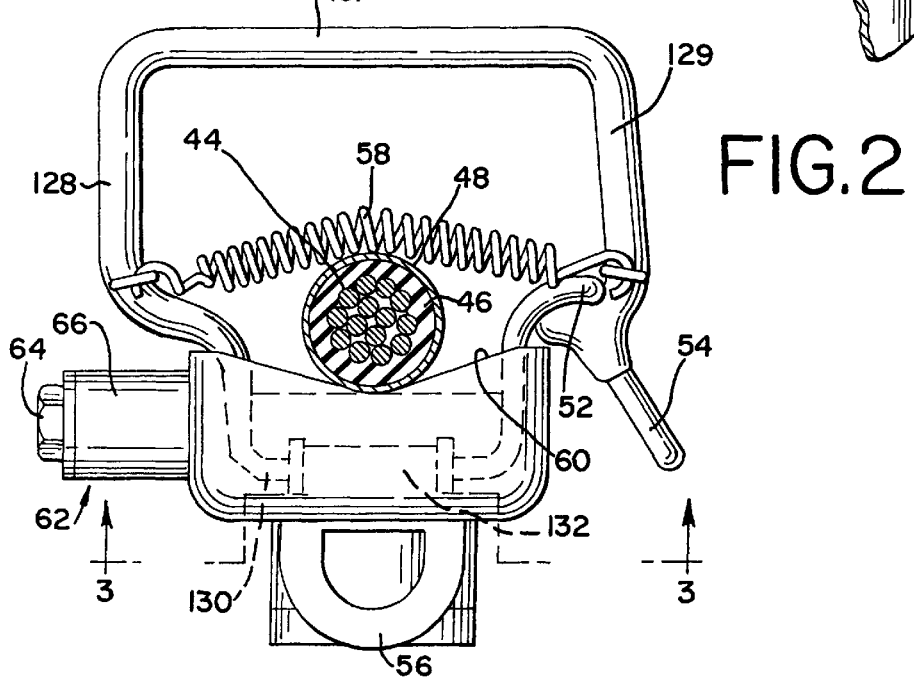

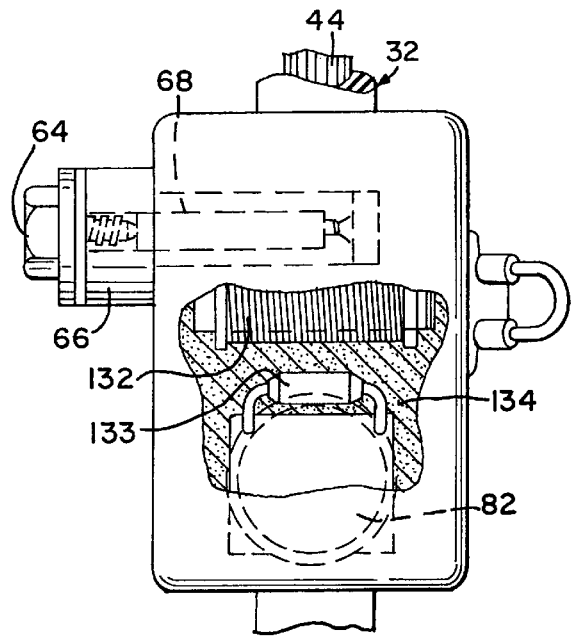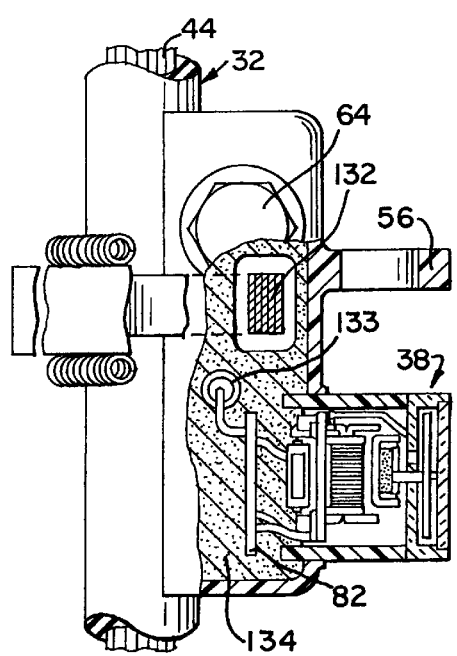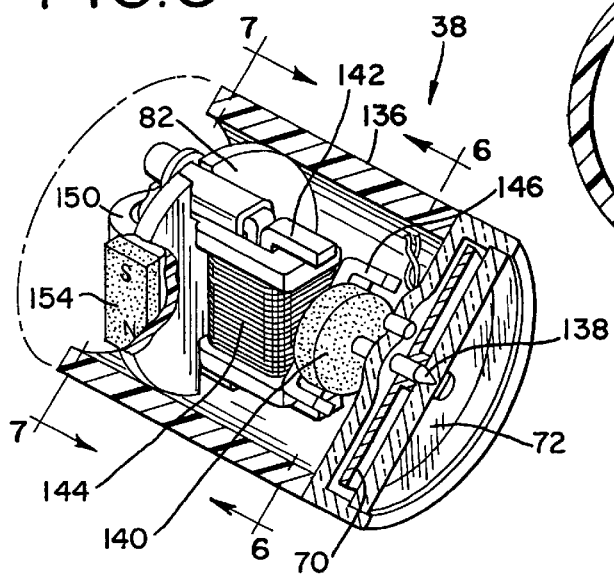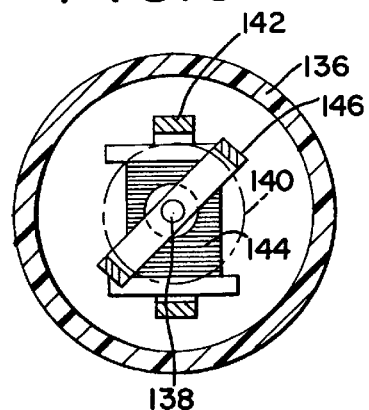

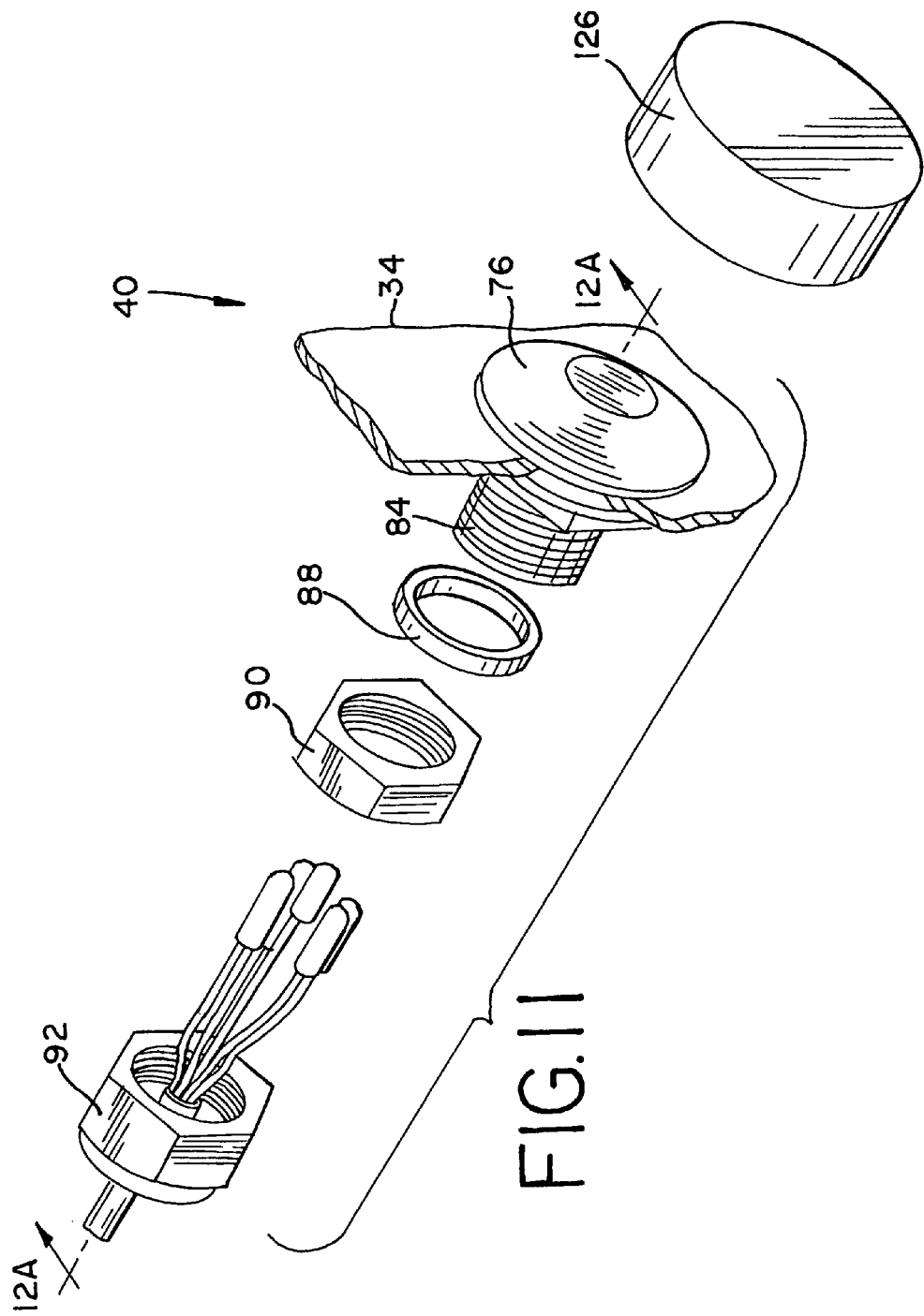

REMOTE LIGHT INDICATION FAULT INDICATOR WITH A TIMED RESET CIRCUIT AND A MANUAL RESET CIRCUIT

BACKGROUND OF THE INVENTION

The present invention relates generally to current sensing devices for electrical systems, and more particularly to alternating current fault indicators for use within closed housings such as are utilized to enclose pad-mounted components in an underground power distribution system.

Various types of self-powered fault indicators have been constructed for detecting electrical faults in power distribution systems, including clamp-on type fault indicators, which clamp directly over cables in the systems and derive their operating power by inductive coupling to the monitored conductor, and test point type fault indicators, which are mounted over test points on cables or associated connectors of the systems and derive their operating power by capacitively coupling to the monitored conductor. Such fault indicators may be either of the manually reset type, wherein it is necessary that the inductors be physically reset, or of the self-resetting type, wherein the indicators are reset upon restoration of line current. Examples of such fault indicators are found in products manufactured by E. 0. Schweitzer Manufacturing Co. of Mundelein, Ill., and in U.S. Pat. Nos. 3,676,740, 3,906,477, 4,063,171, 4,234,847, 4,375,617, 4,438,403, 4,456,873, 4,458,198, 4,495,489, and 5,677,678.

Detection of fault currents in fault indicators is typically accomplished by means of a magnetic reed switch in close proximity to the conductor being monitored. Upon occurrence of a fault current, an abnormally high magnetic field is induced around the conductor. As a result, the contacts of the magnetic reed switch close and actuate trip or fault circuitry which magnetizes an internal pole piece to position a target indicator, which is visible from the exterior of the indicator, to a trip or fault indicating position.

In certain applications, such as where the fault indicator is installed in a dark or inaccessible location, it would be beneficial if the indication of a fault were accomplished by means of a light source. More specifically, when the circuit monitoring module of the fault indicator is located in an inaccessible location, such as within an equipment or system component enclosure, it would be beneficial if the fault indication were accomplished by means of a light source within easy view and preferably viewable from ouside the enclosure. Under such circumstances, fault indication is easy, particularly when dark. Repair crews can then more easily find the location of the fault.

In those applications, it would be beneficial if the fault indicator included circuitry that would automatically reset the light indication of the fault occurrence upon the expiration of a predetermined period of time, yet would provide the light indication for such predetermined period of time, irrespective of whether normal line current is restored to the monitored conductor. Moreover, in this same application, it would be beneficial if the fault indicator included circuitry that permitted manual reset of the light indication upon demand. Such circuitry would conserve the finite energy available from the battery or other energy source connected to the light source.

Because of the compact construction and limited power available in self-powered fault indicators, it is preferable that the light indication be provided with the minimal additional circuitry and structure within the fault indicator which would provide reliable and extended operation following an occurrence of a fault.

With the increased use of underground electrical distribution systems using primary and secondary feeder cables which are directly buried in the ground and brought to the surface only for connection to pad-mounted distribution transformers or other system components, the need has arisen for fault indicators suitable for mounting within the above-ground metal enclosures tyically utilized to house and protect such components. Preferably, such fault indicators should be sufficiently compact so as to not interfere with other components in the enclosures. Further, such indicators would preferably indicate the occurrence of a fault current in a manner permitting a lineman to view the circuit status without having to open the enclosure. Additionally, such indicators, which would typically require use of a lithium battery or similar energy source, would preferably include means for testing whether the battery has sufficient energy to illuminate the connected light source.

In addition, such indicators would preferably include timed reset circuitry for resetting the light indication upon expiration of a predetermined period of time. This circuitry would allow light indication of the occurrence of a fault current for a predetermined period of time after such occurrence, even after normal line current is restored in the monitored conductor. Furthermore, such indicators would preferably include a manual reset circuit for resetting the light indication of a fault current upon demand.

The present invention is directed to a novel fault indicator which meets the above requirements by utilizing a magnetic winding, such as the actuator winding of the electromechanical indicator flag assembly typically utilized in fault indicators, in conjunction with a magnetic circuit which, upon occurrence of a fault, connects an internal battery to a light source mounted to an equipment enclosure and viewable external thereof. The present invention is also directed to a fault indicator of the type described above wherein the fault indicator includes a timed reset circuit for automatically resetting the light indication of the fault occurrence upon expiration of a predetermined period of time. The present invention is further directed to a fault indicator of the type described above wherein the fault indicator includes a manual reset circuit for manually resetting the light indication of the fault occurrence upon demand. Both reset circuits conserve the finite energy available from the battery or other energy source connected to the light source.

The present invention is further directed to a fault indicator for detection of faults within an equipment enclosure, such as the type used to house pad-mounted transformers and other system components in an electrical distribution system, wherein fault indications are provided at a light indicator viewable external of the enclosure, thereby obviating the need for visual contact with the interior of the enclosure. Additionally, the present invention is directed to a fault indicator of the type described above wherein the fault indicator includes means for testing whether the energy level of the energy source is sufficient to illuminate the connected light source.

Accordingly, it is a general object of the present invention to provide a new and improved fault indicator for use in conjunction with enclosed pad-mounted power distribution system components.

It is another object of the present invention to provide a new and improved fault indicator having a light indication of fault occurrence.

It is another object of the present invention to provide a compact and economical fault indicator which provides an indication of circuit status at a light indicator located remote from the circuit monitoring module of the fault indicator.

It is yet another object of the present invention to provide a fault indicator wherein a light indication is provided utilizing a remote fault indicator light module in conjunction with an internal battery.

It is another object of the present invention to provide a fault indicator wherein the light indication of a fault occurrence may be automatically reset upon the expiration of a predetermined period of time to provide indication of such fault occurrence during such predetermined period of time, irrespective of whether normal line current has been restored to the monitored cable, which also conserves the finite energy available from the battery or other energy source connected to the light source.

It is still another object of the present invention to provide a fault indicator wherein the light indication of the fault occurrence may be manually reset upon demand, such as after viewing the light indication, thereby conserving the finite energy available from the battery or other energy source connected to the light source.

It is yet another object of the present invention to provide a fault indicator utilizing a remote fault indicator light module in conjunction with an internal battery wherein the fault indicator includes means for testing whether the energy level of the internal battery is sufficient to illuminate the light source contained within the remote fault indicator light module.

SUMMARY OF THE INVENTION

The present invention is directed to a fault indicator that provides indication of a fault current outside the exterior surface of an electrical equipment enclosure. The fault indication is presented following the occurrence of a fault current in an electrical conductor within the enclosure. The fault indicator includes a circuit monitoring module and a remote fault indicator light module operatively connected thereto. The remote fault indicator light module is mounted to the exterior surface of the enclosure. A battery is contained within the circuit monitoring module and a light source is contained within the remote fault indicator light module. The light source is operable from the battery.

A magnetic circuit is included in the fault indicator, which includes a magnetic pole piece, a magnetically actuated switch and a bias magnet. The bias magnet has a permanent magnetic polarity which opposes a magnet field in the magnet pole piece in one direction, and reenforces a magnetic field in the magnetic pole piece in the other direction. As a result, the magnetically actuated switch is conditioned to open in response to a magnetic field in one direction and close in response to a magnetic field in the other direction.

The fault indicator further includes circuit means having a magnetic winding in magnetic communication with the magnetic pole piece. The winding is responsive to the current in the monitor conductor for developing a magnetic field in the pole piece in one direction to condition the magnetically actuated switch open during normal current flow in the monitored conductor. The winding also develops a magnetic field within the pole piece in the opposite direction to condition the magnetically actuated switch closed upon occurrence of a fault current in the conductor. The magnetically actuated switch is connected between the battery and light source to cause the light source to be illuminated upon the occurrence of a fault current.

The fault indicator further includes reset circuitry, such as a timed reset circuit for automatically resetting the light indication of the fault occurrence upon the expiration of a predetermined period of time. The fault indicator may further include a manual reset circuit for manually resetting the light indication of the fault occurrence upon demand. The manual reset circuit may comprise a magnetically actuated switch contained within the remote fault indicator light module wherein the switch is connected to a timing capacitor included within the timed reset circuit.

The remote fault indicator light module may have a bolt-shaped housing, which includes a transparent head. Further, the light source may comprise a light emitting diode and a flasher circuit may cause the light emitting diode to flash.

In another aspect of the present invention, another magnetically actuated switch may be contained within the remote fault indicator light module to connect the battery to the light source. This additional magnetically actuated switch permits a lineman to test the sufficiency of the energy level of the battery and determine whether the battery is capable of causing illumination of the light emitting diode or other light source.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 1 is a perspective view of a fault indicator constructed in accordance with the invention having an inductively powered clamp-on circuit monitoring module, which includes an integral fault indicator flag module, and a remote fault indicator light module, the latter of which houses a light source.

FIG. 2 is a top plan view of the fault indicator of FIG. 1 showing the engagement between the circuit monitoring module and the cable.

FIG. 3 is a cross-sectional view of the fault indicator of FIGS. 1 and 2 taken along line 3—3 of FIG. 2.

FIG. 4 is a cross-sectional view of the fault indicator of FIGS. 1–3 taken along line 4—4 of FIG. 2.

FIG. 5 is a perspective view partially in section showing the principal components, including those of the indicator flag assembly, contained within the integral fault indicator flag module of the fault indicator of FIGS. 1–4.

FIG. 6 is a cross-sectional view of the indicator flag assembly taken along line 6—6 of FIG. 5.

FIG. 11 is an exploded perspective view of the remote fault indicator light module of the fault indicator shown in FIG. 1 and a magnet used to test the sufficiency of the energy level of the battery contained within the battery compartment of the circuit monitoring module.

DETAILED DESCRIPTION OF THE PREFERRED EMBODIMENTS

Figure 7:
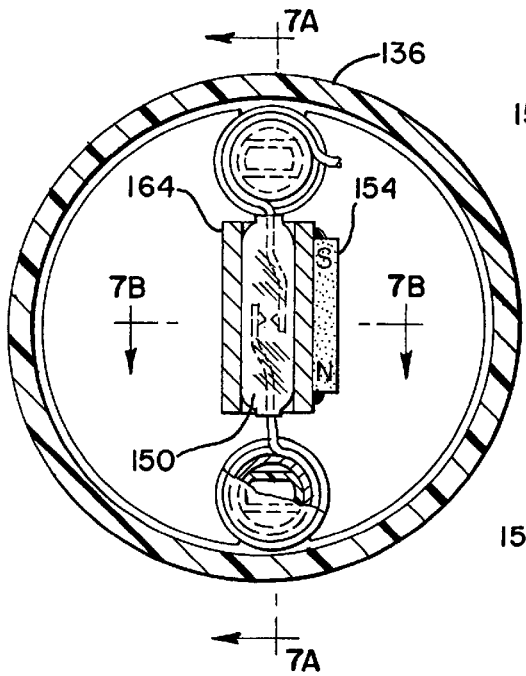
FIG. 7 is an enlarged cross-sectional view of the auxiliary contacts contained within the integral fault indicator flag module taken along line 7—7 of FIG. 5.
Figure 7A:
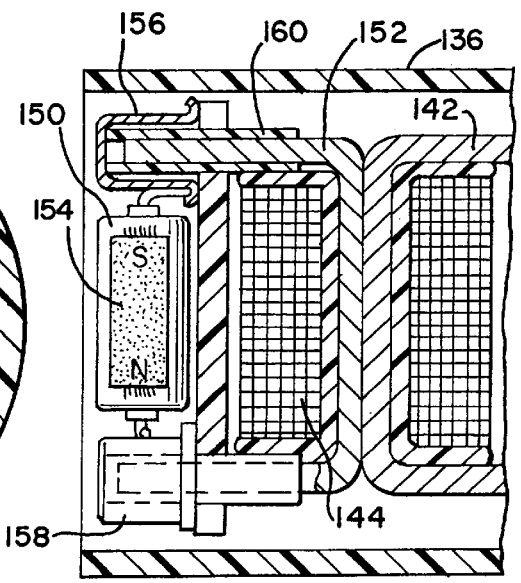
FIG. 7A is a cross-sectional view of the indicator flag assembly taken along line 7A—7A of FIG. 7.
Figure 7B:
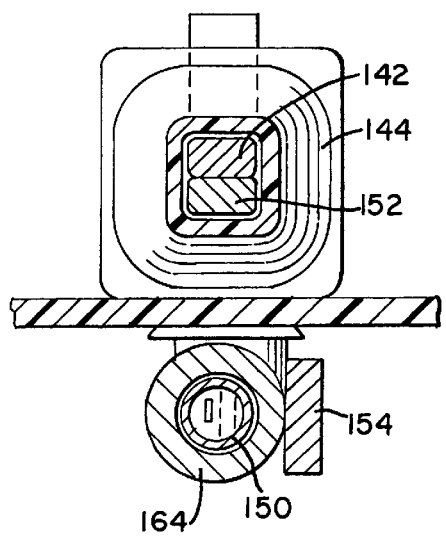
FIG. 7B is a cross-sectional view of the indicator flag assembly taken along line 7B—7B of FIG. 7.

Referring to the figures, and particularly to FIG. 1, the fault indicator system 30 of the invention is shown in conjunction with an electrical feeder or distribution cable 32 of conventional construction for use in high voltage underground alternating current power systems. The fault indicator system 30 monitors cable 32 near a transformer or other component of the system, which, in accordance with conventional practice in such underground systems, is pad-mounted above the ground and enclosed within a tamper-proof weather-sealed protective housing or equipment enclosure 34. The purpose of fault indicator system 30 is to provide at the exterior of housing 34 an indication of the occurrence of a fault within the system, and to this end the fault indicator system includes a clamp-on circuit monitoring module 36, having an integral fault indicator flag module 38, and a remote fault indicator light module 40 providing an external light indication by which the circuit status can be determined.

The integral fault indicator flag module 38 projects from the front face of the housing 42 of circuit monitoring module 36 so as to be easily viewed when the fault indicator is installed. In accordance with conventional practice, the circuit monitoring module 36 is attached to the outer surface of cable 32, which may include a central conductor 44, a concentric insulating layer 46, and an electrically-grounded outer sheath 48.

Circuit monitoring module 36 includes the housing 42 within which circuitry for sensing the occurrence of a fault current in central conductor 44 and actuating both integral fault indicator flag module 38 and remote fault indicator light module 40 is contained. A magnetic core assembly 50 for attaching the circuit monitoring module to a monitored conductor (such as cable 32) and for providing sufficient magnetic coupling to the conductor to power the circuitry is also contained within the housing 42 of circuit monitoring module 36.

The magnetic core assembly 50 is preferably formed as a closed loop of generally rectangular configuration so as to completely encircle cable 32, and includes a gap 52 by which the core assembly can be opened to facilitate installation on or removal from a monitored conductor. A hook 54 on the core assembly 50 and an eye 56 on housing 42 may be provided to allow use of conventional lineman tools, such as a hot stick, during installation or removal. A spring 58 holds gap 52 closed and presses cable 32 into a V-shaped recess 60 on housing 42. A battery holder 62 is positioned on the side of housing 42 and includes a removable end cap 64 which provides access to a cylindrical battery compartment 66 within which a battery 68 (see FIG. 3) is contained.

Within its integral fault indicator flag module 38, the circuit monitoring module 36 also includes, in accordance with conventional practice, a status-indicating flag 70 for indicating circuit status. The flag 70 may be viewed through a window 72 at the front of the integral fault indicator flag module 38.

In operation, during normal current flow in central conductor 44, status-indicating flag 70 is positioned by circuitry in circuit monitoring module 36 so as to present a white or reset condition-indicating surface 70A (see FIGS. 8A and 8B) to the viewer. Upon the occurrence of a fault or trip current in central conductor 44, the status-indicating flag 70 is repositioned by the circuitry so as to present a red or fault condition-indicating surface 70B (see FIGS. 10A and 10B) to the viewer.

As further shown in FIG. 1, remote fault indicator light module 40 includes a transparent bolt-shaped housing 74, having a transparent head 76, which permits a light source shown in its preferred form of a light emitting diode (LED) 78 to illuminate and be seen by a lineman without requiring him to open equipment enclosure 34. In that regard, bolt-shaped housing 74 is mounted to enclosure 34 and LED 78 is electrically connected to battery 68 (see FIG. 3) contained within battery compartment 66.

The LED 78 is preferably connected to the circuitry contained within the circuit monitoring module 36 by a multiple conductor cable 80. Cable 80 enters housing 42 through an aperture in the housing wall to provide for convenient connection between the conductors of the multiple conductor cable 80 and the individual components mounted on circuit board 82.

Figure 12A:
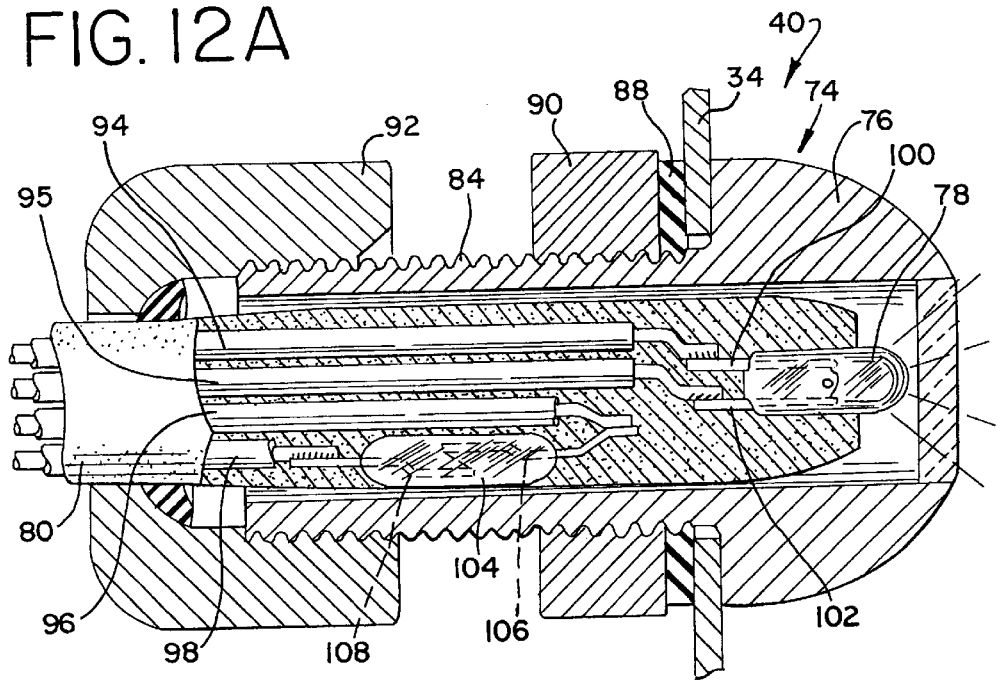
FIG. 12A is an enlarged cross-sectional view of the remote fault indicator light module taken along line 12—12 of FIG. 11 shown in its preferred form when the fault indicator does not include an instant reset switch.
Figure 12B:
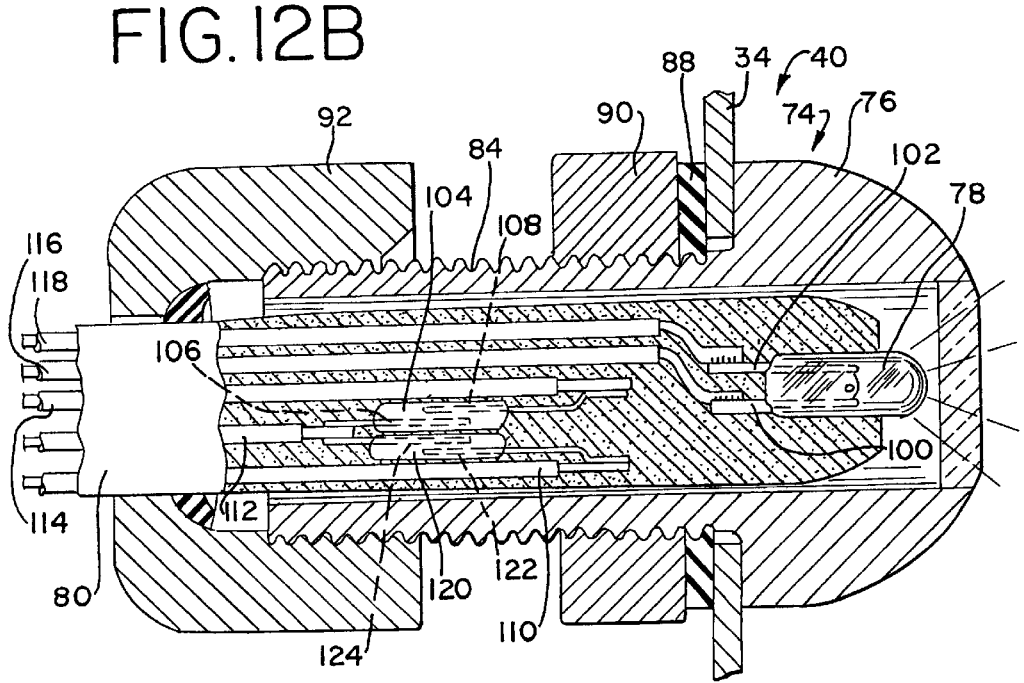
FIG. 12B is an enlarged cross-sectional view of the remote fault indicator light module taken along line 12—12 of FIG. 11 shown in its preferred form when the fault indicator includes an instant reset switch.

Referring ahead to FIGS. 11, 12A and 12B, transparent bolt-shaped housing 74 is preferably formed of a tamper-proof polypropylene or clear plastic material. Housing 74 includes a threaded shank 84 which extends through an aperture in the wall of equipment enclosure 34. Housing 74 also includes the rounded transparent head 76, which is of relatively larger diameter and is mounted on the exterior surface of enclosure 34 in a manner which prevents the housing from being pulled back into the enclosure 34 through aperture 86. The entire remote fault indicator light module 40 may be secured in position on the exterior surface of enclosure 34 by means of a washer 88 and an internally threaded nut 90 matingly engaged to the externally threaded shank 84 of housing 74. Bolt-shaped housing 74 may also include another internally threaded nut 92 matingly engaged to the distal end portion of shank 84 to provide strain relief for multiple conductor cable 80.

In operation, during normal current flow in central conductor 44, LED 78 will not illuminate absent actuation of the battery test circuitry or additional timed reset circuitry. Upon the occurrence of a fault or trip current in central conductor 44, however, LED 78 will illuminate and begin to flash so that it may be seen through the transparent head 76 of bolt-shaped housing 74 and a lineman may view the indication of a fault current in conductor 44 without having to open equipment enclosure 34.

Referring to the embodiment of the remote fault indicator light module 40 shown in FIG. 12A, its bolt-shaped housing 74 contains a plurality of conductors 94, 95, 96, 98 therein which extend through the multiple conductor cable 80 and connect circuit components in the light module with those in the circuit monitoring module 36. The LED 78 is preferably contained within bolt-shaped housing 76 and has one of its terminals 100 connected to conductor 94 and its other terminal 102 connected to conductor 95. As so connected, LED may operate properly. Further contained within bolt-shaped housing 74 is a magnetically actuated reed switch 104 which permits the sufficiency of the energy level of battery 68 to be tested. One contact 106 of magnetic reed switch 104 is connected to conductor 96 and its other contact 108 is connected to conductor 98. It will be appreciated that the preferred form of remote fault indicator light module 40 shown in FIG. 12 will be used when it does not include an instant reset switch hereinafter described contained therein.

Referring to the embodiment of the remote fault indicator light module 40 shown in FIG. 12B, its bolt-shaped housing 74 contains a plurality of conductors 110, 112, 114, 116 and 118 therein which extend through the multiple conductor cable 80 and connects circuit components in the light module with those in the circuit monitoring module 36. A magnetically actuated reed switch 120, which provides instant reset of the LED 78, has one of its contacts 122 connected to conductor 110 and its other contact 124 connected to conductor 112. Upon actuation of magnetic reed switch 120, LED 78 is instantaneously reset and is caused to no longer flash because the closure of contacts 122, 124 of magnetic reed switch 120 breaks the circuit between battery 68 and LED 78.

In FIG. 12B, LED 78 and magnetic reed switch 104 are also contained within bolt-shaped housing 74. Magnetic reed switch 104 has one contact 106 connected to conductor 112 and its other contact 108 connected to conductor 114. LED 78, on the other hand, has its terminal 100 connected to conductor 116 and its terminal 102 connected to conductor 118.

FIG. 11 shows a magnet 126 that may be placed close to transparent head 76 of bolt-shaped housing 74 to actuate magnetic reed switch 104 in FIG. 12A or magnetic reed switches 104, 120 in FIG. 12B. Actuation of magnetic reed switch 120, if used, will reset LED 78 instantly so that it no longer flashes and will condition the circuitry within circuit monitoring module 36 for detection of a subsequent fault current. On the other hand, magnetic reed switch 104 will be actuated to test the sufficiency of the energy level of the battery 68 to see whether it can cause illumination of LED 78.

Although magnet 126 is shown in FIG. 11 as a simple circular magnet, it will be appreciated that magnet 126 may be any shape or have any construction so long as it is capable of creating a magnetic field of sufficient magnitude to close magnetic reed switches 104, 120, as desired.

Referring back to FIG. 2, the magnetic core assembly 50 of circuit monitoring module 36 may consist of a plurality of individual strips or laminations formed of oriented silicon steel arranged side-by-side in a generally rectangular closed-loop configuration. The magnetic core assembly 50 is preferably encapsulated in a layer of resin epoxy insulating material. The rectangular configuration of magnetic core assembly 50 includes a generally rectilinear first side wall 128, a generally rectilinear second side wall 129 opposed to first side wall 128, a generally rectilinear third wall 130 and a generally rectilinear fourth wall 131 opposed to third wall 130. The closed loop consisting of walls 128–131 includes gap 52 at the juncture of wall 129 and wall 130. Wall 128 is drawn towards wall 129 by the helical spring 58 which extends between those walls.

Operating power is provided for the circuitry contained within the housing 42 of circuit monitoring module 36 by a magnetic winding 132, which is in magnetic communication with magnetic core assembly 50. As shown in FIGS. 2–4, winding 132 is coaxially positioned on wall 130 of core assembly 50 and is dimensioned to provide a close fit with the core assembly cross-section. Winding 132 is preferably connected to circuit board 82 on which the circuit components of the circuit monitoring module 36 are mounted. These circuit components include a magnetic reed switch 133, which is positioned with its axis perpendicular to and spaced from the axis of cable 32 so as to respond to fault currents in the central conductor 44 of the cable in a manner well known to the art. The entire assembly, consisting of winding 132, circuit board 82, magnetic reed switch 133 and the other circuit components of the circuit monitoring module 36, may be encapsulated in an epoxy material 134 so as to form within housing 42 at the bottom portion of magnetic core assembly 50 a weather-proof module responsive to the current level in the central conductor 44 of cable 32.

Referring to FIGS. 5–10, the integral fault indicator flag module 38 includes a cylindrical plastic housing 136 within which the components of the module are contained. The disc-shaped circuit board 82 is positioned perpendicularly to the axis of housing 136. Circuit board 82, which may be secured in position by an epoxy material filling the rear of housing 136, serves as mounting means for the circuit components of the circuit monitoring module 36.

To provide an indication of the occurrence of a fault current, the integral fault indicator flag module 38 includes the status-indicating flag 70 mounted for rotation about a pivot axis 138. As best seen in FIGS. 8–10, the face of status-indicating flag 70 has a white segment 70A and a red segment 70B, only one of which is visible at a time through window 72 in the transparent end of integral fault indicator flag module 38.

A permanent flag magnet 140 is pivotally secured to status-indicating flag 70. The permanent flag magnet 140 is preferably formed of a magnetic material having a high coercive force, such as ceramic. Further, it is preferably magnetically polarized to form two magnetic poles of opposite polarity, as indicated in FIGS. 8–10, with opposite magnetic polarities on diametrically opposed sides of the magnet.

A pole piece 142, which is preferably formed of a magnetic material having a relatively low coercive force, such as chrome steel, biases the permanent flag magnet 140 in its reset condition-indicating position. In that regard, as shown in FIG. 5, the ends of pole piece 142 extend along the wall of housing 136, in close proximity to permanent flag magnet 140. As a result, the opposite polarity magnetic poles of flag magnet 140 are attracted to position the status-indicating flag 70 to its reset condition-indicating position. In this position, the white or reset condition-indicating surface 70A is visible through window 72.

Figure 9A:
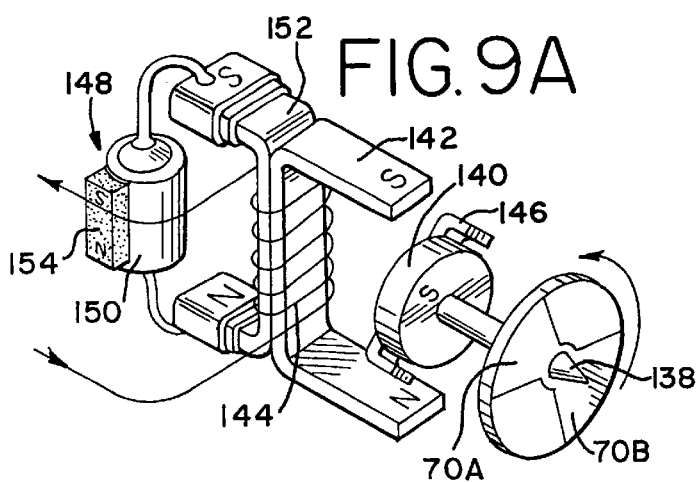
FIGS. 9A and 9B are diagrammatic views similar to FIGS. 8A and 8B, respectively, showing the principal components of the indicator flag assembly in transition between a reset-condition indicating position and a fault-condition indicating position.
Figure 9B:
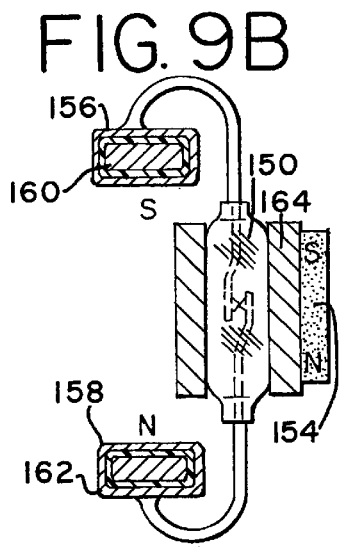
Figure 10A:
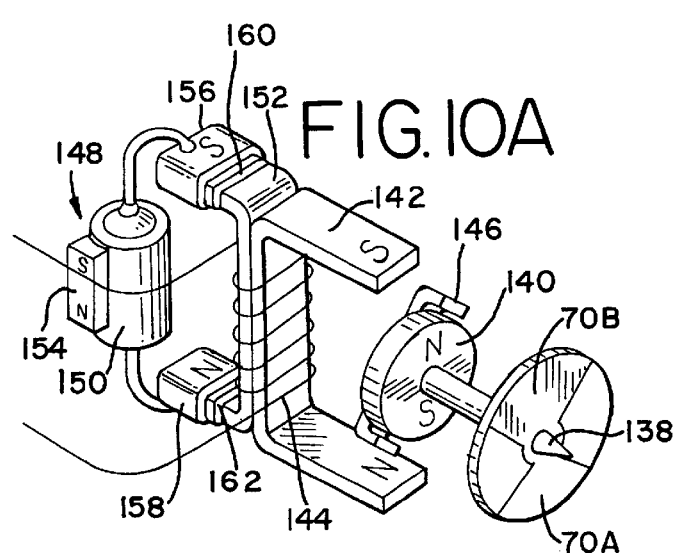
FIGS. 10A and 10B are diagrammatic views similar to FIGS. 8A and 8B, respectively, showing the principal components of the indicator flag assembly in a fault or trip-condition indicating position.
Figure 10B:
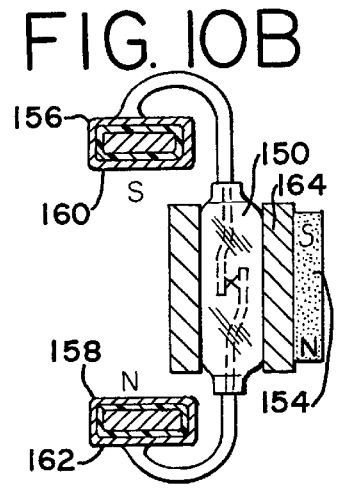

Upon the occurrence of a fault current in central conductor 44 of cable 32, which current may, for example, exceed 4500 amperes, pole piece 142 is magnetized to the magnetic polarities shown in FIGS. 9 and 10 by momentary energization in one direction of a winding 144 wound around the center section of the pole piece. As a result, the poles of permanent flag magnet 140 are repelled by the adjacent like-polarity poles of the pole piece 142 and status-indicating flag 70 is caused to rotate 180 degrees to its fault or trip condition-indicating position, as shown in FIGS. 10A and 10B. In this position, the red or fault condition-indicating surface 70B of status-indicating flag 70 is visible through window 72 and a lineman viewing the integral fault indicator flag module 38 is advised that a fault current has occurred in central conductor 44.

Status-indicating flag 70 remains in its trip or fault condition-indicating position until the ends of pole piece 142 are subsequently remagnetized to the magnetic polarities shown in FIGS. 8A and 8B, by momentary energization of winding 144 with a current in the opposite direction. When this occurs, permanent flag magnet 140 and status-indicating flag 70 are caused to rotate from their fault or trip condition-indicating position shown in FIGS. 10A and 10B to their reset condition-indicating position shown in FIGS. 8A and 8B, and the circuit monitoring module 36 is conditioned to respond to a subsequent fault current.

To prevent status-indicating flag 70 from becoming stalled upon reversal of the magnetic polarities of pole piece 142, as might happen with a target perfectly centered between the poles of the pole piece and having a degree of bearing friction, the circuit monitoring module 36 includes an auxiliary U-shaped pole piece 146, which is made from a material having a relatively low coercive force, such as chrome steel, and is positioned adjacent to permanent flag magnet 140.

Auxiliary pole piece 146 is coaxial with and at an angle to pole piece 142. The existence of a magnetic field between the poles of pole piece 142 results in the production of induced magnetic poles in auxiliary pole piece 146. As a result, upon reversal of the magnetic polarity of the poles of pole piece 142 following occurrence of a fault current, the poles of auxiliary pole piece 146 exert a rotational force on the most adjacent poles of the permanent flag magnet 140.

In turn, this causes a rotational moment to be exerted on status-indicating flag 70, tending to turn the flag in a predetermined (counter-clockwise in FIGS. 8–10) direction such that the flag is prevented from remaining in its reset-condition indicating position, even if it should be perfectly positioned and have a degree of bearing friction. Once rotation has been established, as shown in FIGS. 9A and 9B, the greater force of pole piece 142 overcomes the effect of auxiliary pole piece 146 and rotation continues until the flag is aligned as shown in FIGS. 10A and 10B.

As further shown in FIGS. 5–10, an auxiliary contact closure assembly 148 is also provided in the integral fault indicator flag module 38 which, upon occurrence of a fault current in central conductor 44 of monitored cable 32, causes a magnetically actuated reed switch 150 to close and make a circuit between battery 68 contained within battery compartment 66 and LED 78 contained within transparent bolt-shaped housing 74. This closure of auxiliary contact closure 148, in turn, causes LED 78 to be illuminated so that it can be viewed through transparent head 76 of housing 74 and a lineman does not have to open equipment enclosure 34 to observe the fault indication.

The auxiliary contact closure assembly 148 preferably includes a U-shaped magnetic pole piece 152, which is preferably formed of a magnetic material having a low coercive force, such as chrome steel, the magnetic reed switch 150 and a permanent bias magnet 154, which is preferably formed of a magnetic material having a high coercive force, such as ceramic. Upon closure of the contacts of magnetic reed switch 150, the circuit including battery 68 and its electrically connected LED 78 is made so that the LED, which is included within the remote fault indicator light module 40, is illuminated and caused to flash by its flasher circuit.

Winding 144, described above as wrapping around pole piece 142, also wraps around pole piece 152. As such, the direction of the magnetic field induced in pole piece 152, like that in pole piece 142, is dependent on the direction of current in winding 144. The lead wires of magnetic reed switch 150 are positioned in close proximity to the ends of pole piece 152 to allow for proper action of the reed switch contacts during operation of fault indicator 30. Nevertheless, the lead wires of magnetic reed switch 150 are electrically isolated from pole pieces 142, 152 to prevent the occurrence of a short across the switch. In a preferred embodiment, the lead wires of reed switch 150 can be magnetically coupled to and electrically isolated from the magentic poles of pole piece 152 by soldering or otherwise attaching the switch leads to metallic sleeves 156, 158 fitted over electrically insulating sleeves 160, 162, respectively, which, in turn, are fitted over the magnetic poles of pole piece 152.

To prevent the undesired actuation of magnetic reed switch 150 which may be caused by the external magnetic field associated with central conductor 44 of monitored cable 32, the magnetic reed switch 150 is preferably aligned with its axis generally parallel to the axis of conductor 44. With this alignment, to avoid actuation of magnetic reed switch 150 by the stray magnetic field induced by current flow through winding 130, the magnetic reed switch 150 is preferably contained within a cylindrical sleeve 164, which is preferably formed of a magnetically conductive material, such as copper. Bias magnet 154 is preferably positioned along the outside surface of cylindrical sleeve 164 with its axis parallel-spaced to the axis of magnetic reed switch 150. It will be noted and understood by those skilled in the art, however, that under the circumstances where conductor 44 is sufficiently spaced from magnetic reed switch 150 so that the magnetic field induced by current flow through conductor 44 is insufficient to cause closure of the contacts of magnetic reed switch 150, the magnetic reed switch can be aligned with its axis perpendicular to the axis of winding 144 to minimize the effect of winding 144 on actuation of the magnetic reed switch. Under such circumstances, cylindrical sleeve 164, which magnetically shields magnetic reed switch 150, may not be required.

Figure 8A:
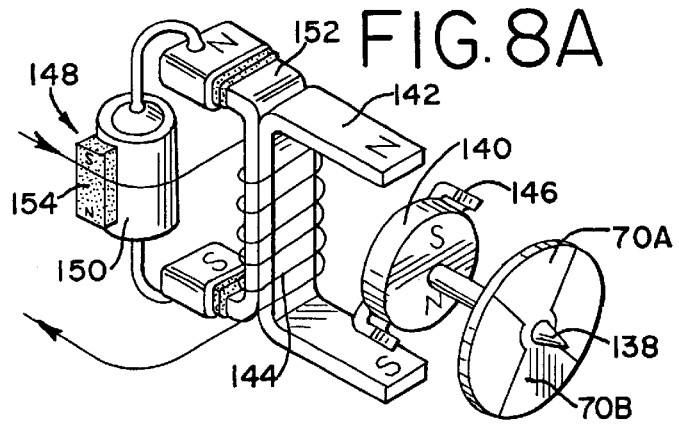
FIGS. 8A and 8B are diagrammatic views of the principal components of the indicator flag assembly shown in a reset-condition indicating position.

Referring still to FIGS. 8–10, in operation, when fault indicator 30 is in its reset-indicating state with the status-indicating flag 70 positioned as shown in FIG. 8A, the polarization of pole piece 152 is also as shown in FIG. 8A. If bias magnet 154 were not present and positioned as shown in FIG. 8A so that each of its poles were magnetized in a manner in which its polarity were opposite that of the respective pole of pole piece 152 closest thereto, the magnetic field existing between the poles of pole piece 152 would cause the contacts of magnetic reed switch 150 to close. However, bias magnet 154 is polarized to oppose the magnetic poles of pole piece 152 when the poles of pole piece 152 are polarized as shown in FIG. 8A so that the magnetic field between those poles is sufficiently weakened and magnetic reed switch 150 will not close to make the circuit between battery 68 and LED 78.

Upon the occurrence of a fault current in central conductor 44 of cable 32, pole piece 152 is magnetized to the magnetic polarities shown in FIGS. 9 and 10 by momentary energization in one direction of winding 144 wrapped around the center section of pole piece 152. Under these circumstances, bias magnet 154 strengthens the magnetic field applied to the contacts of magnetic reed switch 150, causing those contacts to close. As a result, the circuit connecting battery 68 and LED 78 is made so that the LED illuminates through transparent head 76 of the transparent bolt-shaped housing 74 of remote fault indicator light module 40. Upon initiation of the flash cycle by the flasher circuit of LED 78, the operation of which is described below, the LED begins to flash so that a lineman viewing the remote fault indicator light module 40 is advised that a fault current has occurred in central conductor 44 without having to open equipment enclosure 34.

The contacts of magnetic reed switch 150 remain closed until the ends of pole piece 152 are subsequently remagnetized to the magnetic polarities shown in FIGS. 8A and 8B, by momentary energization of winding 144 with a current in the opposite direction. When this occurs, the contacts of magnetic reed switch 150 are opened, which causes the circuit between battery 68 and LED 78 to be broken absent actuation of timed reset circuitry and/or battery test circuitry, and the circuit monitoring module 36, including magnetic reed switch 150, is conditioned to respond to a subsequent fault current.

As described above, it will be noted that energization of winding 144 by current in one direction upon occurrence of a fault current in central conductor 44 causes status indicating flag 70 to rotate so that its red or fault condition-indicating surface 70B is visible through window 72. Simultaneously therewith, energization of winding 144 by current in that same direction causes the contacts of magnetic reed switch 150 to close, thereby making the circuit between battery 68 and LED 78.

Figure 8B:
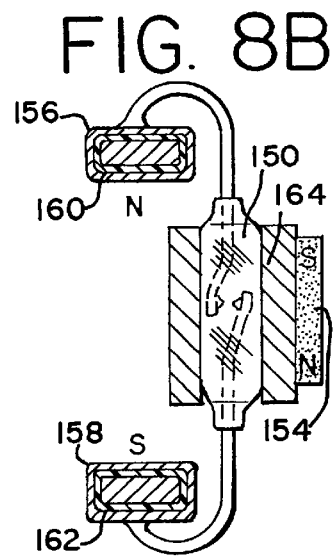

As will further be understood, energization of winding 144 by current in the opposite direction upon restoration of current in central conductor 44 will cause status-indicating flag 70 to rotate back to its reset condition-indicating position so that the white or reset condition-indicating surface 70A of status-indicating flag 70 is visible through window 72, as shown in FIGS. 8A and 8B. At that same time, the energization of winding 144 by current in that direction causes the contacts of magnetic reed switch 150 to open so that the circuit between battery 68 and LED 78 is broken (absent actuation of timed reset circuitry and/or battery test circuitry) and the LED will not be illuminated and caused to flash by its flasher circuit.

Figure 13:
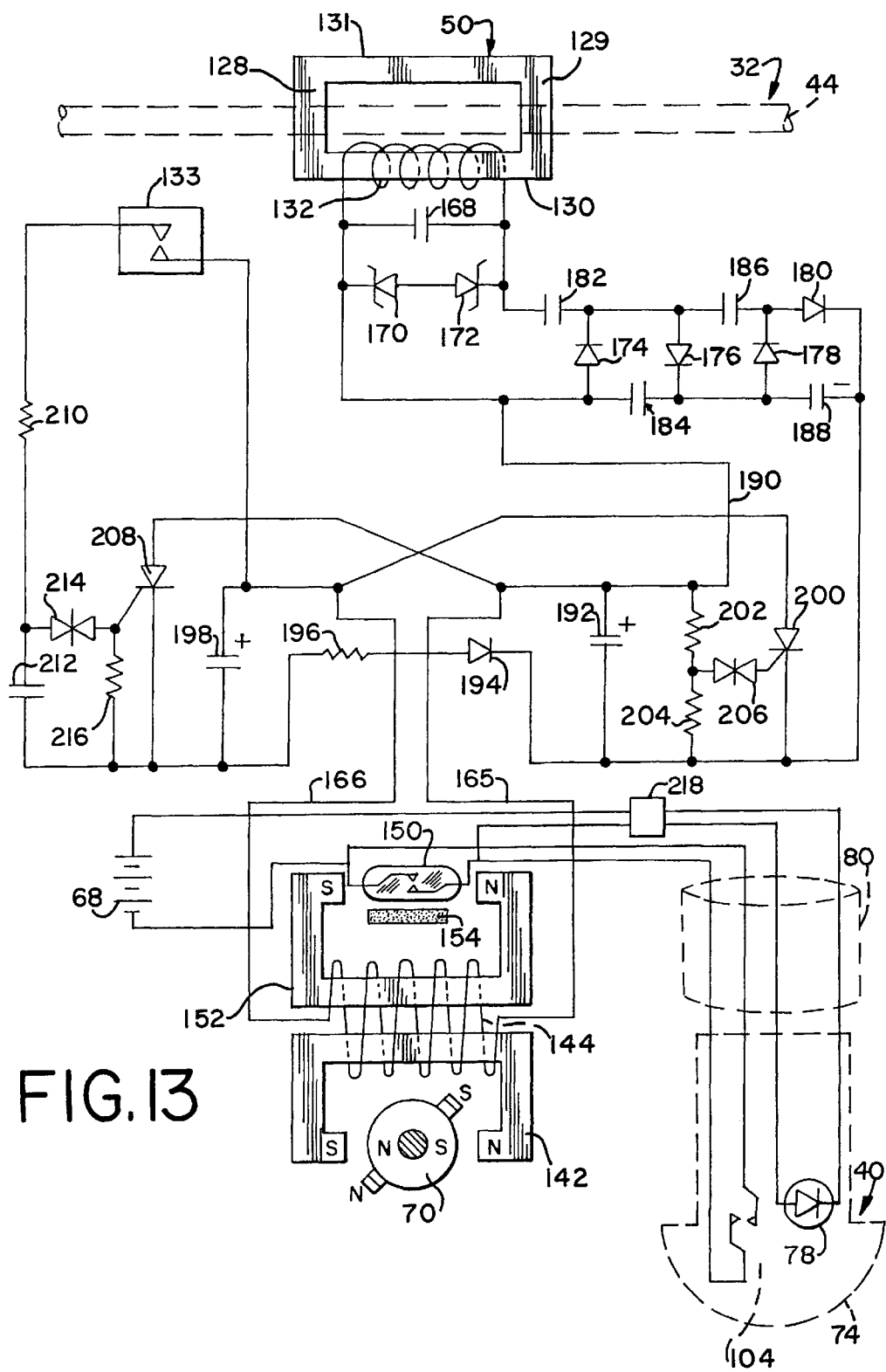
FIG. 13 is an electrical schematic diagram of an embodiment of the circuitry of the fault indicator shown in FIG. 1.

Energization of winding 144 by current in one direction upon occurrence of a fault current in central conductor 44, and energization of winding 144 by current in the opposite direction upon restoration of current in central conductor 44, is accomplished by means of circuitry contained within the housing 42 of circuit monitoring module 36. Referring to the schematic diagram shown in FIG. 13, the winding 144 of circuit monitoring module 36 is connected to the additional circuitry of circuit monitoring module by conductors 165 and 166.

Power for operation of the circuitry within circuit monitoring module 36 is obtained from magnetic winding 132, within which an alternating current is induced in a manner well known in the art as a consequence of alternating current in central conductor 44. Magnetic winding 132 is tuned to resonate at the power line frequency by capacitor 168 and a resultant resonant output signal is peak-limited by a pair of zener diodes 170 and 172 connected back-to-back across the winding.

The resonant signal is increased in voltage by a conventional voltage multiplier circuit comprising diodes 174, 176, 178 and 180 and capacitors 182, 184, 186 and 188 to develop in a manner well known to the art a direct current of sufficient magnitude for powering the remaining circuitry of the circuit monitoring module 36.

The positive polarity output terminal of the voltage multiplier network, formed at the juncture of diode 174 and capacitor 184, is connected to one terminal of winding 144 through a conductor 190, and to one terminal of a storage capacitor 192. The negative polarity output terminal of the voltage multiplier network, formed at the juncture of diode 180 and capacitor 188, is connected to the remaining terminal of storage capacitor 192, and through a forward-biased diode 194 and a current limiting resistor 196 to one terminal of another storage capacitor 198. The other terminal of storage capacitor 198 is connected to the remaining terminal of winding 144. With this arrangement, storage capacitor 192 is charged directly, and storage capacitor 198 is charged through winding 144, by the unidirectional current developed by the voltage multiplier network during normal current flow in central conductor 44 of cable 32.

To provide for periodic energization of winding 144 during normal current flow in conductor 44, one end terminal of winding 144 is connected through a switch device shown in the form of a silicon controlled rectifier (SCR) 200 to the negative polarity terminal of storage capacitor 192. Periodic conduction through SCR 200 is obtained by connecting the gate electrode of that device to the positive polarity output terminal of the voltage divider network comprising a pair of resistors 202 and 204 and a bilateral diode 206. SCR 200 is periodically triggered into conduction when the voltage developed across bilateral diode 206 as a result of storage capacitor 192 being charged by the voltage multiplier network reaches the threshold level of the bilateral diode. This causes a current flow in a first direction in winding 144, with the result being that status-indicating flag 70 is positioned as shown in FIGS. 8A and 8B and LED 78 contained within the remote indicator module 40 is not illuminated because the contacts of the magnetic reed switch 150 are open. Forward-biased diode 194 prevents storage capacitor 198 from being discharged through SCR 200 upon conduction of the SCR, leaving storage capacitor 198 available for energizing winding 144 in a reverse direction in response to the occurrence of a fault current in central conductor 44.

Winding 144 is energized in the reverse direction upon occurrence of a fault current in central conductor 44 by discharge of storage capacitor 198 through another SCR 208 having its cathode connected to the negative polarity terminal of storage capacitor 198, and its anode connected to the other end of winding 144. Conduction is established through SCR 208 by closure of the contacts of magnetic reed switch 133, which is connected between the positive polarity terminal of storage capcitor 198 and the gate electrode of SCR 208 by a network comprising a resistor 210 and a capacitor 212, a bilateral diode 214, and a resistor 216.

Magnetic reed switch 133 is positioned within housing 42 in sufficiently close proximity to central conductor 44 such that the contacts of the reed switch close upon occurrence of a fault current in the conductor. Upon this occurrence, the positive polarity terminal of storage capacitor 198 is connected through the closed contacts of magnetic reed switch 133 and the circuit comprising resistors 210 and 216, bilateral diode 214, and capacitor 212 to the gate electrode of SCR 208, rendering that device conductive. This causes storage capacitor 198 to discharge through SCR 208, thereby energizing winding 144 in the reverse direction to position status-indicating flag 70 as shown in FIGS. 10A and 10B and illuminate LED 78 contained within the transparent bolt-shaped housing 74 of remote fault indicator light module 40. LED 78 is caused to flash by its connected flasher circuit 218.

To preclude the possibility of currents of opposite direction being applied to winding 144 by simultaneous conduction of SCR 200 and SCR 208, a predetermined time delay before conduction of SCR 200 may be provided. This is accomplished by resistor 210 and capacitor 212, which together form an RC time constant network in the gate circuit of SCR 208. Upon closure of the contacts of magnetic reed switch 133, storage capacitor 198 will charge through resistor 210 to the threshold voltage of bilateral diode 214 before sufficient gate electrode current is supplied to SCR 208 to initiate conduction in that device. In accordance with conventional practice, resistor 216 serves as a current drain path for the gate electrode.

The time delay provided is designed to ensure that should a fault occur simultaneously with the periodic energization of winding 98 in a reset direction, storage capacitor 192 will have completely discharged before winding 144 is energized to signal the detection of a fault.

Thus, in operation, winding 144 is supplied with current in one direction from storage capacitor 192 and in an opposite direction from storage capacitor 198. Storage capacitor 192 is connected to one terminal of winding 144, and storage capacitor 198 is connected to the other terminal of the winding. One switch device, SCR 200, periodically completes the discharge circuit for storage capacitor 192 to one terminal of winding 144 during periodic reset conditions. Another switch device, SCR 208, completes the discharge circuit for storage capacitor 198 to the opposite terminal of winding 144 upon the occurrence of a fault current in central conductor 44.

The two storage capacitors 192 and 198 are simultaneously charged by a charging circuit which includes the line curent-powered voltage multiplier network. Capacitor 192 is charged directly and capacitor 198 is charged through winding 144, isolation diode 194 and resistor 196. Diode 194 provides isolation for the trip circuit upon operation of the reset circuit.

In accordance with the invention, a light indication of fault occurrence is obtained by connecting battery 68 through the contacts of magnetic reed switch 150 upon the occurrence of a fault current, or, alternatively, through the contacts of magnetic reed switch 104 during a battery test operation, to a flasher circuit 218, which provides a flashing signal to LED 78. Flasher circuit 218 is preferably a commercially available component adapted to power LED 78.

Battery 68 is preferably a thionyl chloride lithium battery, such as type TL-593-S manufactured by TADIRAN, Ltd. of Israel, which provides a constant 3.6 volt output to depletion. Flasher circuit 218 and LED 78, although shown as separate components, may be a single component. It will be appreciated that flashing circuits other than the types shown and described may be used.

As described above with reference to FIGS. 11, 12 and 12A, actuation of magnetic reed switch 104 causes battery 68 to be applied to the flasher circuit 218 irrespective of whether a fault current has occurred in conductor 44. Furthermore, when an instant reset switch, such as magnetic reed switch 120 is included within the circuitry (see FIG. 14), actuation thereof causes LED 78 to be reset instantly as more specifically described below. Magnetic reed switch 104 and magnetic reed switch 120 can both be actuated by use of the magnet 126 shown in FIG. 11.

Figure 14:
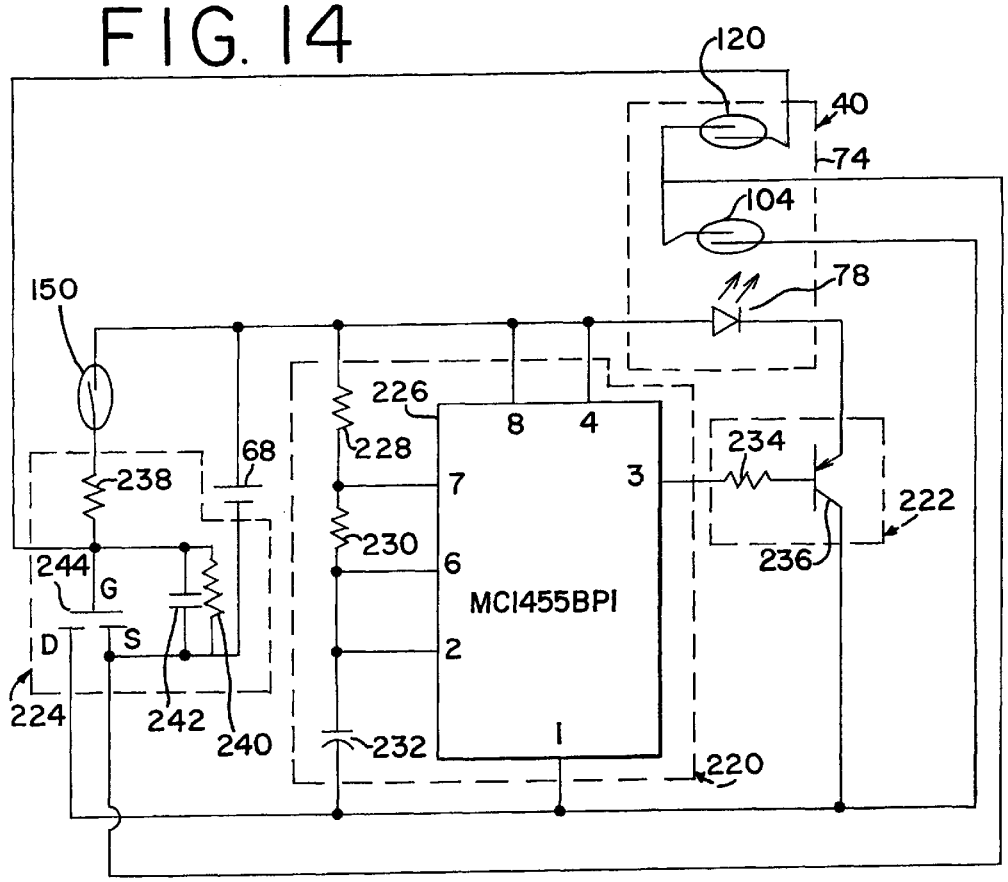
FIG. 14 is an electrical schematic diagram of another embodiment of the circuitry of the fault indicator shown in FIG. 1 wherein the circuitry includes a timed reset circuit and an instant reset switch.

Referring to FIG. 14, a circuit providing reset functions is shown. As will be appreciated, the circuit shown in FIG. 14 will preferably also include the conventional trip and rest circuitry shown in FIG. 13. The circuit of FIG. 14 is shown to include, in general, a timing circuit 220, a driver circuit 222 and a timed reset circuit 224. FIG. 14 also shows magnetic reed switches 104, 120 and LED 78, which are contained within the bolt-shaped housing 74 of the remote fault indicator light module 40, magnetic reed switch 150, which is actuated upon the occurrence of a fault current in conductor 44, and battery 68, which is an energy source for the LED.

The timing circuit 220 preferably includes a semiconductor chip that is a highly stable controller 226 capable of producing accurate time delays or oscillation, such as an MC 1455 series chip, such as those manufactured by Motorola, Inc. of Schaumburg, Ill. The chip of preference is the MC1455BP1 chip, which is packaged in a plastic dual in-line packaging (DIP) and has an operating temperature range between −40° Celsius and 85° Celsius. The timing circuit 220 includes an external passive component network comprising resistors 228, 230 and capacitor 232. Resistors 228, 230 and capacitor 232 are set to predetermined values to determine the duty cycle of timing circuit 220. As timing circuit 220 oscillates, it controls the driver circuit 222.

The driver circuit 222 shown in FIG. 14 preferably includes a resistor 234 and a PNP transistor 236. Upon application of a control signal to the base electrode of PNP 236, that device is rendered conductive and LED 78 is permitted to illuminate provided a fault current has occurred or a battery test operation has been initiated. Any control signal is applied to the base electrode of PNP 236 in accordance with the output signal of timing circuit 220.

The timed reset circuit 224 preferably includes resistors 238, 240, capacitor 242, and a field effect transistor 244 (FET). Upon the occurrence of a fault current in central conductor 44 of cable 32, magnetic reed switch 150 is closed as described above and a voltage is applied between the gate and source electrodes of FET 244 by battery 68. Simultaneously therewith, timing capacitor 242 stores a sufficient charge until the voltage across its terminals is identical to that of battery 68. As a result, capacitor 242 holds the gate electrode of FET 244 at a higher voltage than its source electrode. This renders the path between the drain and source electrodes of FET 244 conductive and establishes conductivity between battery 68 and LED 78 during the intervals of time when PNP 236 is conductive. As a result, LED 78 flashes until such time as the voltage across the terminals of capacitor 242 reaches a sufficiently low value to render the path between the drain and source electrodes of FET 244 nonconductive. As will be appreciated by those skilled in the art, resistor 240 is a current drain for capacitor 242.

As further shown in FIG. 14, magnetic reed switch 120 contained within the bolt-shaped housing 74 of remote fault indicator light module 40 causes, upon its actuation, a short between the gate and source electrodes of FET 244 and, likewise, between the two terminals of capacitor 242. As will be appreciated, FET 244 is thereby rendered nonconductive and LED 78 is reset instantaneously.

As further shown in FIG. 14, magnetic reed switch 104, upon its actuation, shorts the drain and source electrodes of FET 244, establishing a conductive path between battery 68 and LED 78 during the intervals of time when PNP 236 is conductive. As will be appreciated, actuation of magnetic reed switch 104 permits a lineman to test the energy level of battery 68 to determine whether it is sufficient to cause illumination of LED 78.

Figure 15:
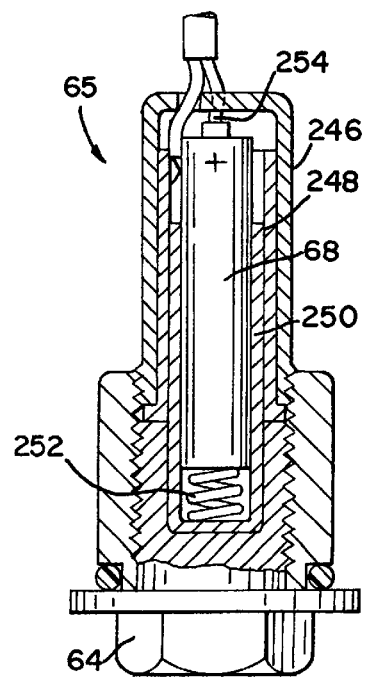
FIG. 15 is an enlarged view of the battery holder utilized in the fault indicator of FIG. 1.

Referring to FIG. 15, battery holder 65 preferably includes a cylindrical fixed portion 246 in which is provided a cylindrical metallic inner sleeve 248. This sleeve is dimensioned to receive a cylindrical metallic outer sleeve 250 attached to end cap 64. When end cap 64 is installed, the outer sleeve 250 fits coaxially within the inner sleeve 248 to establish an electrical connection to one end of battery 68. The outer sleeve 250 is dimensioned to slidably receive battery 68, which is engaged by a helical spring 252 within end cap 64, thus assisting in holding the battery in place when the end cap is installed. A single transverse pin 254 establishes electrical connection to the other end of battery 68.

It will be appreciated that while the remotely located fault indicator light source arrangement of the invention has been shown incorporated in an inductively coupled current powered fault indicator, the inventive arrangement finds equal utility in capacitively coupled electrostatical power fault indicators such as those mounted on system test points, which utilize an electromagnetically actuated indicator.

Thus, a compact externally-powered fault indicator has been described which upon sensing of a fault current provides a contact closure for external signaling and control purposes to effectuate fault indication by a light source housed within a remote fault indicator light module. The fault indicator further includes two reset circuits for resetting the light indication of the fault occurrence. Among other advantages derived from the incorporation of the reset circuits into a fault indicator, they conserve the finite energy available from the battery connected to the light source.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A fault indicator for providing indication of a fault current outside the exterior surface of an electrical equipment enclosure following the occurrence of a fault current in an electrical conductor within the enclosure and for resetting the indication of said fault current, comprising:
   a circuit monitoring module;
   a remote fault indicator light module operatively connected to said circuit monitoring module and mounted to said exterior surface of said enclosure;
   a battery contained within said circuit monitoring module;
   a light source contained within said remote fault indicator light module operable from said battery;
   a magnetic circuit including a magnetic pole piece, a magnetically actuated switch and a bias magnet, said bias magnet having a magnetic polarity which opposes a magnetic field in said magnetic pole piece in one direction, and reenforces a magnetic field in said magnetic pole piece in the other direction, whereby said magnetically actuated switch is conditioned to open in response to a magnetic field in said one direction and close in response to a magnetic field in said other direction;
   circuit means including a magnetic winding in magnetic communication with said magnetic pole piece and responsive to the current in the monitored conductor for developing a magnetic field in said pole piece in a direction to condition said switch open during normal current flow in the monitored conductor, and for developing a magnetic field in said pole piece in said opposite direction to condition said switch closed upon occurrence of a fault current in the conductor;
   said magnetically actuated switch connecting said battery to said light source;
   said light source providing a light indication of said occurrence of said fault current; and
   a timed reset circuit for maintaining said fault indication for a predetermined period of time and resetting said light source upon expiration of said predetermined period of time.

2. A fault indicator as defined in claim 1 further comprising a manual reset circuit.

3. A fault indicator as defined in claim 2 wherein said manual reset circuit comprises a magnetically actuated manual reset switch contained within said remote fault indicator light module.

4. A fault indicator as defined in claim 3 wherein said magnetically actuated manual reset switch is connected to a timing capacitor included within said timed reset circuit means.

5. A fault indicator as defined in claim 1 wherein said magnetic pole piece includes a pair of spaced-apart magnetic poles, and said magnetically actuated switch is disposed between said poles.

6. A fault indicator as defined in claim 5 wherein said magnetically actuated switch comprises a reed switch.

7. A fault indicator as defined in claim 6 wherein the axis of said reed switch is aligned generally parallel to the axis of said monitored conductor.

8. A fault indicator as defined in claim 7 wherein said magnetic pole piece is generally U-shaped.

9. A fault indicator as defined in claim 1 wherein said remote fault indicator light module comprises a bolt-shaped housing.

10. A fault indicator as defined in claim 9 wherein said bolt-shaped housing comprises a transparent head.

11. A fault indicator as defined in claim 1 wherein said light source comprises a light emitting diode.

12. A fault indicator as defined in claim 11 further comprising a flasher circuit for flashing said light emitting diode.

13. A fault indicator as defined in claim 1 further comprising a second magnetically actuated switch contained within said remote fault indicator light module connecting said battery to said light source.

14. A fault indicator for providing indication of a fault current outside the exterior surface of an electrical equipment enclosure following the occurrence of a fault current in an electrical conductor within the enclosure and for resetting the indication of said fault current, comprising:
   a circuit monitoring module having an integral fault indicator flag module;
   a remote fault indicator light module operatively connected to said circuit monitoring module;
   a battery contained within said circuit monitoring module;
   a light source contained within said remote fault indicator light module and operable from said battery;
   a magnetic circuit including a magnetic pole piece, a magnetically actuated switch and a bias magnet, said bias magnet having a magnetic polarity which opposes a magnetic field in said magnetic pole piece in one direction, and reenforces a magnetic field in said second magnetic pole piece in the other direction, whereby said magnetically actuated switch is actuated open in response to a magnetic field in said one direction and closed in response to a magnetic field in said other direction;

circuit means including a magnetic winding in magnetic communication with said magnetic pole piece and responsive to the current in the monitored conductor for developing a magnetic field in said one direction in said pole piece to condition said magnetically actuated switch closed upon occurrence of a fault current in the conductor;

said magnetically actuated switch connecting said battery to said light source;

said light source providing a light indication of said occurrence of said fault current;

a timed reset circuit for maintaining said fault indication for a predetermined period of time and resetting said light source upon expiration of said predetermined period of time; and a manual reset circuit including a magnetically actuated manual reset switch contained within said remote fault indicator light module.

15. A fault indicator as defined in claim 14 wherein said timed reset circuit comprises a timing capacitor.

16. A fault indicator as defined in claim 15 wherein said magnetically actuated manual reset switch is connected to said timing capacitor.

17. A fault indicator as defined in claim 14 wherein said magnetic pole piece includes a pair of spaced-apart magnetic poles, and said magnetically actuated switch is disposed between said poles.

18. A fault indicator as defined in claim 17 wherein said magnetically actuated switch includes a pair of projecting leads, and said leads are mechanically connected to but electrically isolated from said magnetic poles.

19. A fault indicator as defined in claim 18 wherein said magnetically actuated switch comprises a reed switch.

20. A fault indicator as defined in claim 19 wherein the axis of said reed switch is aligned generally parallel to the axis of said monitored conductor.

21. A fault indicator as defined in claim 14 wherein said light source comprises a light emitting diode.

22. A fault indicator as defined in claim 21 further comprising a flasher circuit for flashing said light emitting diode.

23. A fault indicator as defined in claim 14 further comprising a second magnetically actuated switch contained within said remote fault indicator light module connecting said battery to said light source.

24. A fault indicator for providing indication of a fault current outside the exterior surface of an electrical equipment enclosure following the occurrence of a fault current in an electrical conductor within the enclosure and for resetting the indication of said fault current, comprising:

a circuit monitoring module having an integral fault indicator flag module;

a remote fault indicator light module operatively connected to said circuit monitoring module and mounted to said exterior surface of said enclosure;

a battery contained within said circuit monitoring module;

a light source contained within said remote fault indicator light module and operable from said battery;

an indicator flag rotatbly mounted in said integral fault indicator flag module and viewable from the exterior of said flag module;

a first magnetic pole piece having magnetic poles in magnetic communication with said indicator flag, said flag assuming a reset-indicating position in response to a magnetic field in said first magnetic pole piece in one direction and a trip-indicating position in response to a magnetic field in said first magnetic pole piece in the other direction;

a magnetically actuated switch;

a second magnetic pole piece having magnetic poles in magnetic communication with said magnetically actuated switch, and a bias magnet opposing a magnetic field in said second magnetic pole piece in said one direction and reenforcing a magnetic field in said second magnetic pole piece in said other direction whereby said magnetically actuated switch is actuated to open in response to a magnetic field in said one direction and is actuated closed in response to a magnetic field in said second magnetic pole piece in said other direction;

circuit means including a magnetic actuator widning in magnetic communication with said first and second magnetic pole pieces for inducing magnetic field in said one direction in each of said pole pieces when said fault indicator is in a reset state, and in said other direction when said fault indicator is in a trip state;

said magnetically actuated switch connecting said battery to said light source;

said light source providing a light indication of occurrence of said fault current;

a timed reset circuit for maintaining said fault indication for a predetermined period of time and resetting said light source upon expiration of said predetermined period of time; and a manual reset circuit including a magnetically actuated manual reset switch contained within said remote fault indicator light module.

25. A fault indicator as defined in claim 24 wherein said timed reset circuit means comprises a timing capacitor.

26. A fault indicator as defined in claim 25 wherein said magnetically actuated manual reset switch is connected to said timing capacitor.

27. A fault indicator as defined in claim 24 wherein said auxiliary magnetic pole piece includes a pair of spaced-apart magnetic poles, and said magnetically actuated switch is disposed between said poles.

28. A fault indicator as defined in claim 27 wherein said magnetically actuated switch includes a pair of projecting leads, and said leads are mechanically connected to but electrically isolated from said magnetic poles.

29. A fault indicator as defined in claim 28 wherein said magnetically actuated switch comprises a reed switch.

30. A fault indicator as defined in claim 29 wherein the axis of said reed switch is aligned generally parallel to the axis of said monitored conductor.

31. A fault indicator as defined in claim 24 wherein said auxiliary magnetic pole piece is generally U-shaped.

32. A fault indicator as defined in claim 31 wherein said actuator winding is wound on a portion of said first magnetic pole piece and a portion of said second magnetic pole piece.

33. A fault indicator as defined in claim 24 wherein said light source is a light emitting diode.

34. A fault indicator as defined in claim 33 further comprising a flasher circuit for flashing said light emitting diode.

35. A fault indicator as defined in claim 24 further comprising another magnetically actuated switch contained within said remote fault indicator light module connecting said battery to said light source.

* * * * *